Figure 1:
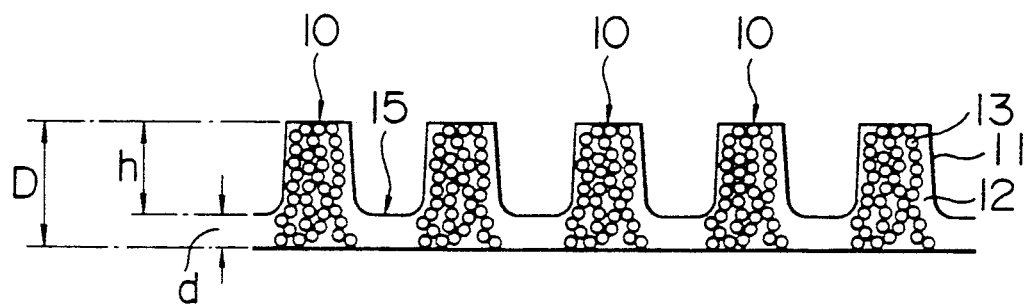

United States Patent [19]

Suyama et al.

[11] Patent Number: 5,132,058

[45] Date of Patent: Jul. 21, 1992

[54] PROCESS FOR PRODUCING THE ANISOTROPICALLY ELECTROCONDUCTIVE SHEET

[75] Inventors: Shinichi Suyama, Iruma; Yuiti Haruta, Hirakata, both of Japan

[73] Assignee: Japan Synthetic Rubber Co., Ltd., Tokyo, Japan

[21] Appl. No.: 588,944

[22] Filed: Sep. 27, 1990

[30] Foreign Application Priority Data

Sep. 29, 1989 [JP] Japan .................................. 1-252214

[51] Int. Cl.⁵ ............................................. B29C 67/00
[52] U.S. Cl. ..................................... 264/24; 264/104; 264/108
[58] Field of Search ........................... 264/24, 104, 108

[56] References Cited

U.S. PATENT DOCUMENTS

| | | | |
|---|---|---|---|
| 2,584,441 | 2/1952 | Fredendall | 264/24 |
| 4,209,481 | 6/1980 | Kashivo et al. | 264/24 |
| 4,292,261 | 9/1981 | Kotani et al. | 264/24 |
| 4,571,542 | 2/1986 | Kozo Arai | 324/158 P |
| 4,737,112 | 4/1988 | Jin et al. | 439/66 |
| 4,778,635 | 10/1988 | Hechtman et al. | 264/24 |
| 4,863,757 | 9/1989 | Durand | 427/47 |

FOREIGN PATENT DOCUMENTS

86/00173 1/1986 World Int. Prop. O. .

*Primary Examiner*—Mary Lynn Theisen
*Attorney, Agent, or Firm*—Oblon, Spivak, McClelland, Maier & Neustadt

[57] ABSTRACT

A process for producing an anisotropically electroconductive sheet having a plurality of electroconductive portions extending in the direction of the thickness of the sheet, including the steps of forming a layer of a molding material consisting of a mixture of electroconductive particles and a high-molecular-weight substance in a cavity of a mold consisting of a pair of upper and lower molds and applying an anisitropic magnetic field to the molding material layer when a space is present between the molding surface of the upper mold and the molding material layer, to fluidize the molding material and simultaneously move the electroconductive particles in the molding material to areas where the magnetic field is applied, thereby allowing the electroconductive particles to gather in said areas to form the electroconductive portions including projecting portions.

8 Claims, 5 Drawing Sheets

PROCESS FOR PRODUCING THE ANISOTROPICALLY ELECTROCONDUCTIVE SHEET

This invention relates to an electric inspection unit using an anisotropically electroconductive sheet and a process for producing the anisotropically electroconductive sheet.

Anisotropically electroconductive sheets are useful as materials for achieving electrical connection in various applications because of their structural characteristics.

However, in the inspection of a base board for a printed wiring board or the like, pin probes have heretofore been used as materials for achieving electric connection.

The pin probes are, however, difficult to miniaturize because of their structural restriction. Accordingly, they are inappropriate for electric inspection of a base board which now tends to be made as fine as possible. Moreover, when the electrode in a portion to be inspected is a surface electrode, a point contact is formed, and therefore, a bad contact tends to be caused. In particular, pin probes are quite inadequate for electric inspection of a base board for surface-mounting technology (referred to hereinafter as the SMT base board) which is now being widely used.

On the other hand, anisotropically electroconductive sheets have no such structural limitations as in the case of pin probes in the electric inspection of a base board, and can be produced in such a form as to be applicable to a conduction-insulation test of a printed wiring boards which have increasingly high mounting density, a representative of which is the SMT base board.

Anisotropically electroconductive sheets which have heretofore been known are those having the following structures:

(1) Structure in which plural insulating rubber sheets are alternately laminated to plural electroconductive rubber sheets filled with electroconductive carbon particles (see Japanese Patent Application Kokoku No. 56-48,951).

(2) Structure in which metal particles are uniformly dispersed in an elastomer sheet (see Japanese Patent Application Kokai No. 51-93,393).

(3) Structure in which electroconductive magnetic particles are non-uniformly distributed in an elastomer sheet (see Japanese Patent Application Kokai Nos. 53-147,772 and 54-146,873).

However, anisotropically electroconductive sheets having the above structures (1) to (3) are all flat, and hence, it is necessary to apply a large pressure thereto for forming effective electric paths. In addition, in the case of miniaturized printed wiring boards and the like, there are many points to be inspected, and the total necessary pressure becomes considerably large and there is such a problem that the pressing mechanism of inspecting unit must be unusually strong.

Under such circumstances, a proposal has been made of an anisotropically electroconductive sheet structure so that a difference in height is formed between the surface of an electroconductive portion and the surface of an insulating Portion (see Japanese Patent Application Kokai No. 61-250,906).

When an anisotropically electroconductive sheet having a structure in which such a difference in height is formed is used, the total necessary pressure can be reduced.

However, the above anisotropically electroconductive sheet is prepared by a press-molding in the prior art; therefore, a press mold to be used in the press-molding must be prepared in conformity with the shape and size of an anisotropically electroconductive sheet each time. Also, the mold must have a structure which can withstand press-molding. Moreover, when the above anisotropically electroconductive sheet is formed by press-molding, it is difficult to release from the mold because the sheet has a structure in which such a difference in height is formed.

Figure 7:
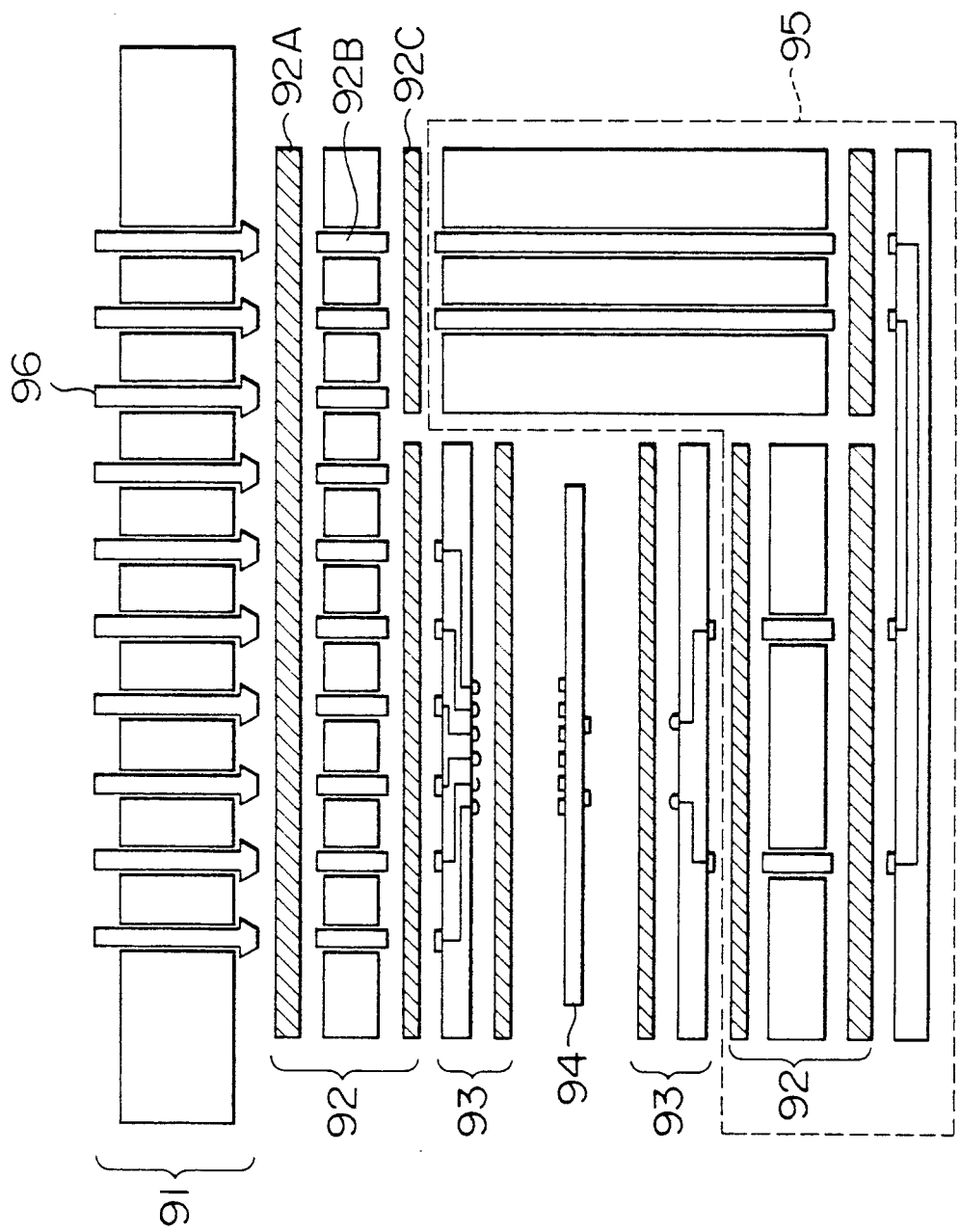

On the other hand, conventional electric inspection unit in which an anisotropically electroconductive sheet is used adopts a so-called intermediary pin system as shown in FIG. 7 in the accompanying drawings. In FIG. 7, 91 refers to an inspection head provided with many inspection electrodes 96, 92 to an intermediary pin system, 93 to an off-glid adaptor, 94 to a printed wiring board and 95 to a back side adaptor.

The intermediary pin system 92 consists of an anisotropically electroconductive sheet 92A, an intermediary pin 92B and another anisotropically electroconductive sheet 92C and has a function of absorbing errors in dimension in the direction vertical to the surface to be inspected of the printed wiring board 94 and a function of preventing electric current from spreading in the transverse direction in the interiors of the anisotropically electroconductive sheets 92A and 92C by the intermediary pin 92B per se to keep the point-to-point correspondence between the inspection electrodes 96 and the portions to be inspected.

However, an electric inspection unit in which such an intermediary pin system is adopted is complicated in structure, has a difficulty in production, and in addition, is so heavy in weight that its handling is not easy. Moreover, the unit has many points at which electric current flows upon contact, and hence, is inferior in reliability.

Therefore, the first object of this invention is to provide an electric inspection unit which has a simple structure and is light weight and by which the inspection of a base board having many portions to be inspected can be conducted with a high reliability.

The second object of this invention is to provide a process for producing an anisotropically electroconductive sheet which can be released easily from a mold using a mold having small pressure-resistance and a simple structure.

Figure 2:
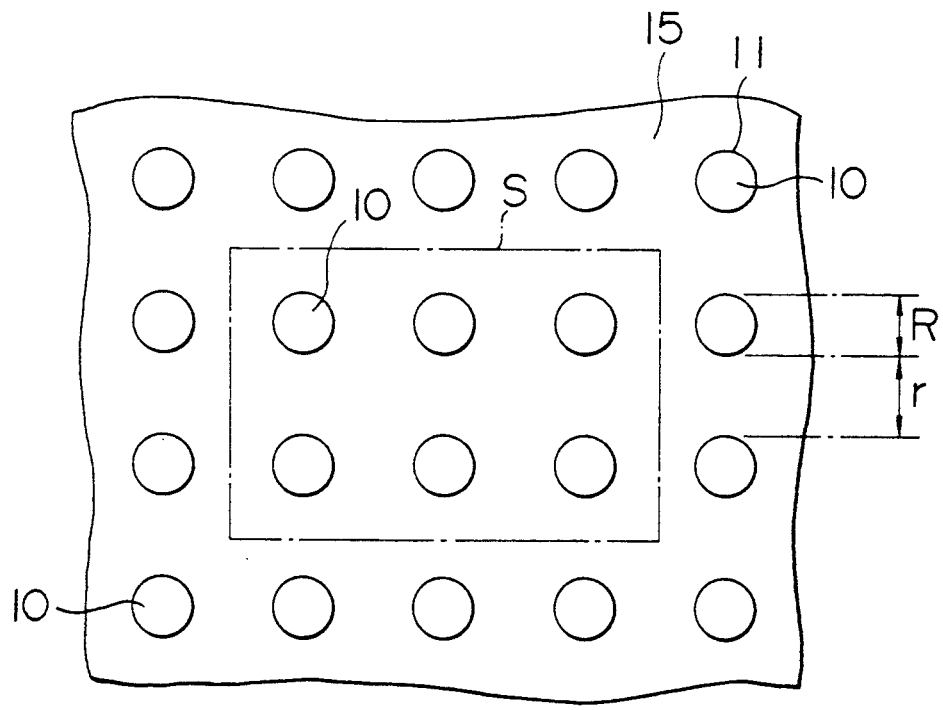
Figure 3:
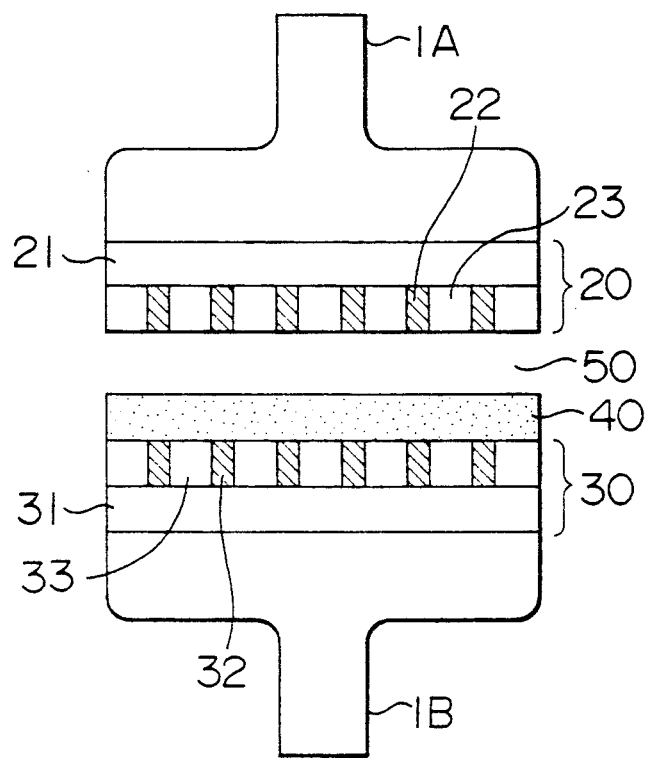
Figure 4:
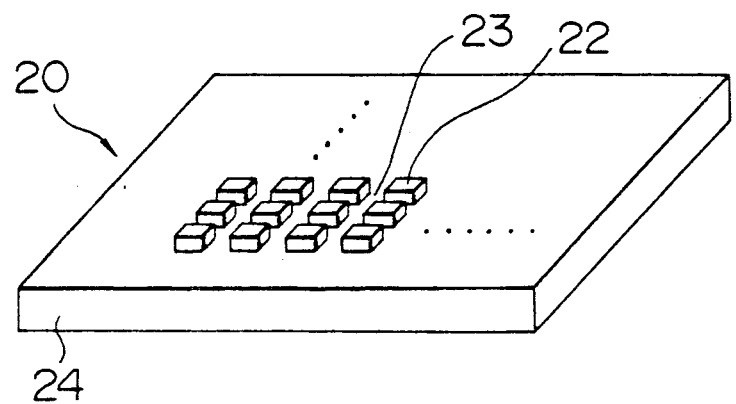
Figure 5:
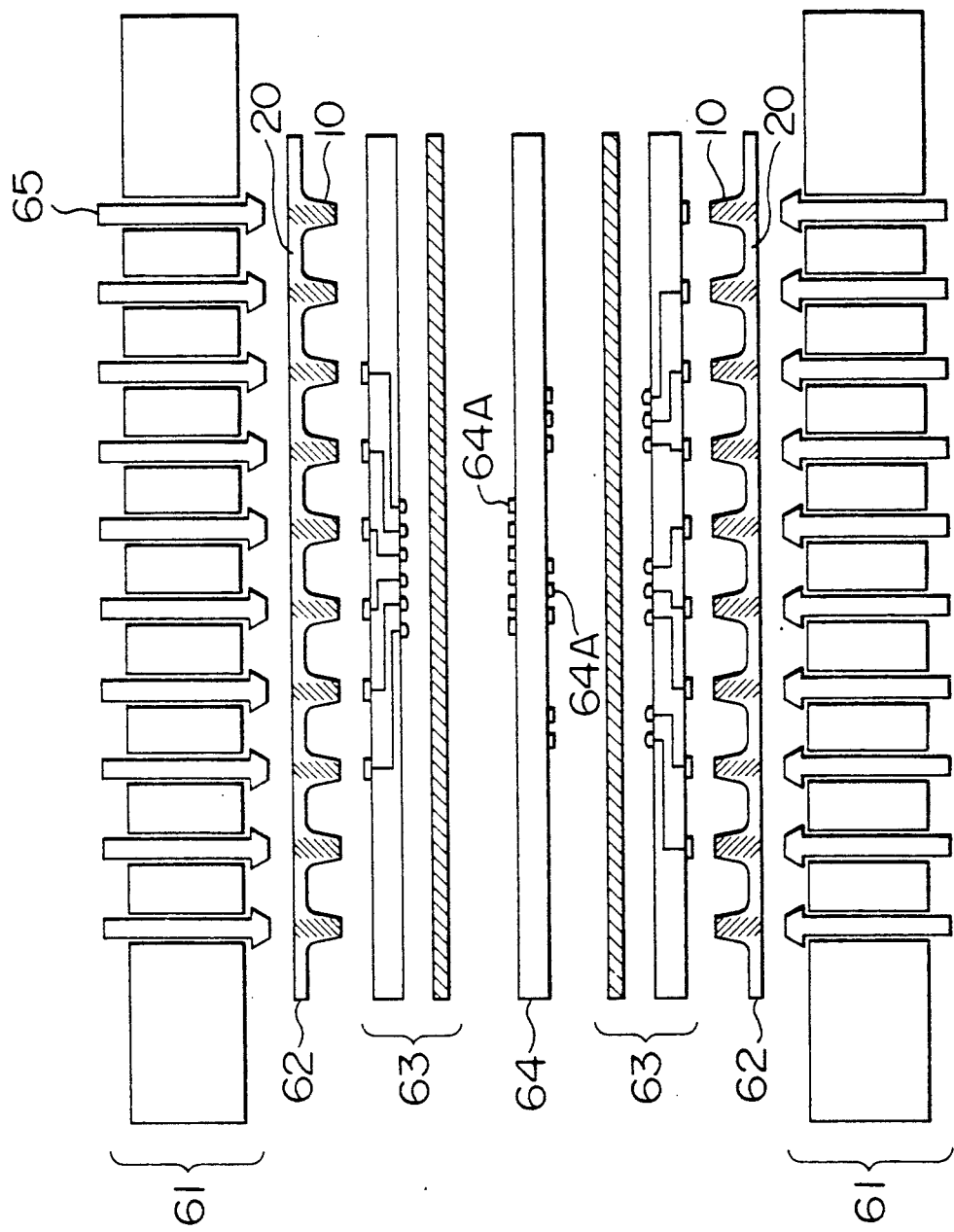
Figure 6:
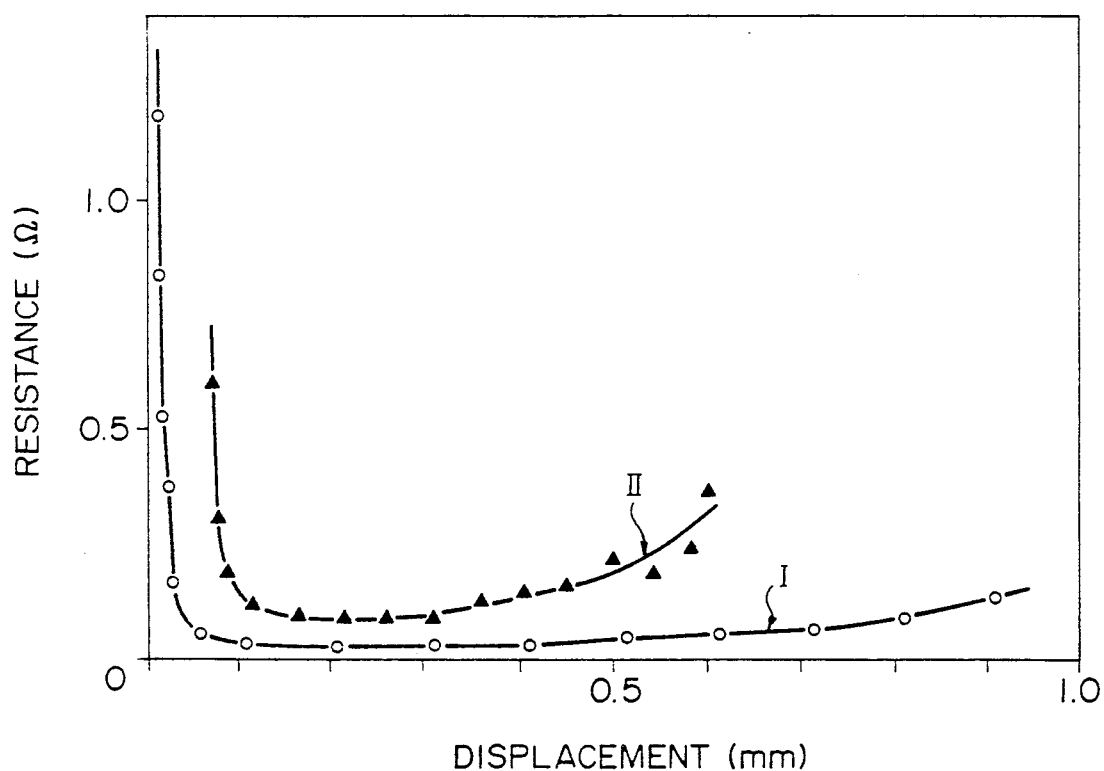

Other objects and advantages of this invention will become apparent from the following description and the accompanying drawings, in which FIGS. 1 and 2 are, respectively, a vertically cross-sectional front view and a plan view of a part of an anisotropically electroconductive sheet to be used in the electric inspection unit of this invention, FIG. 3 is a diagrammatic view showing an example of apparatus for producing an anisotropically electroconductive sheet, FIG. 4 is a perspective view of an example of the molding surface of an upper mold, FIG. 5 is an exploded view of the electric inspection unit of this invention, FIG. 6 is a graph showing the experimental results in Example 4 and Comparative Example 2, and FIG. 7 is an exploded view of an electric inspection unit in which a conventional intermediary pin system is adopted. In these Figures, 10 refers to electroconductive portions, 11 to a projecting portions, 12 to a high-molecular-weight substance, 13 to electroconductive particles, 15 to insulating portions, 20 to the upper mold, 30 to the lower mold, 21 and 31 to base boards, 22 and 32 to ferromagnetic substance portions, 23 and 33 to non-magnetic portions, 24 to a plate of ferromagnetic substance, 40 to a mixture sheet, 50 to a space, 61 to inspection heads, 62 to anisotropically electroconductive sheets, 63 to off-glid adaptors, 64 to a printed wiring board, 65 to an inspection electrode, 64A to portions to be inspected, 91 to an inspection head, 92 to an intermediary pin system, 93 to off-glid adaptors, 94 to a printed wiring board, 95 to a back side adaptor, 96 to inspection electrodes, 92A and 92C to anisotropically electroconductive sheets, and 92B to an intermediary pin system.

According to this invention, there is provided an electric inspection unit comprising many inspection electrodes and an anisotropically electroconductive sheet which is placed so as to be present between the electrodes and a base board to be inserted into the unit when the base board is electrically inspected, characterized in that the anisotropically electroconductive sheet has a plurality of electroconductive portions extending in the direction of thickness of the sheet, which portions are arranged so as to be insulated from one another by insulating portions consisting of an insulating, elastic, high-molecular-weight substance, each of the electroconductive portions being formed in a portion projecting from the surface of the insulating portion by filling the insulating portions densely with electroconductive particles.

This invention further provides a process for producing an anisotropically electroconductive sheet which comprises forming a layer of a molding material consisting of a mixture of electroconductive particles having magnetism and a high-molecular-weight substance in the cavity of a mold consisting of a pair of upper and lower molds, the molding surfaces of each of which is flat or has much smaller concaves and convexes than the height of projecting portions of the anisotropically electroconductive sheet to be produced; applying a magnetic field having an intensity distribution to the molding material layer in the direction of thickness of the layer in the state that a space is present between the molding surface of the upper mold and the upper surface of the molding material layer, to fluidize the molding material while transferring the electroconductive particles by magnetic force, thereby changing the external shape of the molding material layer; and then curing the molding material layer.

Referring to the accompanying drawings, this invention is specifically explained below.

FIGS. 1 and 2 show embodiments of structure of an anisotropically electroconductive sheet to be used in the electric inspection unit of this invention, in which a plurality of electroconductive portions 10 extending in the direction of thickness of the sheet are densely arranged in the form of a matrix in the state that they are separated from one another by insulating portions 15 and each electroconductive portion 10 is formed in a portion projecting from the surface of the insulating portion 15 on one side of the sheet. Incidentally, each electroconductive portion 10 may project on the other side of the sheet.

Each electroconductive portion 10 is formed by filling an insulating, elastic, high-molecular-weight substance 12 densely with electroconductive particles 13, and has such a pressure-sensitive electroconductivity that the resistivity is reduced upon applying pressure. The degree of filling with the electroconductive particles 13 in the electroconductivity portion 10 is preferably 20% by volume or more, particularly preferably more than 40% by volume. Incidentally, when the degree of filling with the electroconductive particles 13 is low, the resistivity of the anisotropically electroconductive sheet is not reduced even when a pressure is applied to the sheet, and hence, highly reliable electric connection becomes difficult.

Incidentally, in the anisotropically electroconductive sheet to be used in the electric inspection unit of this invention, electroconductive portions are formed in the projecting portions; however, an insulating portion having a thickness of about 0.5 mm may be formed around the electroconductive portion in the projecting portion.

The thickness D of the electroconductive portion 10 is determined taking into consideration the projection height h of the projecting portion 11 and the thickness d of the insulating portion. However, when the thickness D of the electroconductive portion 10 is too large, the resistivity in the conductive state is increased, so that the upper limit thereof is preferably about 5 mm, practically 1–5 mm, and particularly preferably 2–4 mm. When the thickness D of the electroconductive portion 10 is in this range, an effective conductivity is surely obtained even when a small pressure is applied.

In addition, the thickness d of the insulating portion 15 is preferably 0.1–0.8 mm in practice. When the thickness d of the insulating portion 15 is in this range, a sufficient insulation is obtained, and at the same time, the projection height h of the electroconductive portion 10 can be set at an adequate value without making the thickness D of the electroconductive portion 10 too large. Incidentally, when the thickness d of the insulating portion 15 is too small, the strength as a sheet becomes low and hence the handling thereof becomes inconvenient. On the contrary, when the thickness d is too large, the projection height h of the electroconductive portion 10 becomes too large, so that the resistivity in the conductive state tends to be increased.

It is preferable that the outer diameter (or the longer side in the case of quadrangle) R of the projecting portion and the shortest distance r between the adjacent projecting portions 11 satisfy the following relation:

$$0.1 \leq \frac{r}{R}.$$

When this relation is satisfied, the displacement in the transverse direction is easily tolerated when the projecting portion 11 is deformed by applying a pressure thereto in the thickness direction. Simultaneously, it is possible to sufficiently avoid the possibility that the adjacent projecting portions 11 are electrically contacted with each other.

In the unit area S effective to the electric connection of an anisotropically electroconductive sheet, it is preferable that the sum total $S_{10}$ of areas of the projecting portions 11 and the sum total $S_{20}$ of areas of the insulating portions 15 satisfy the following relation when the maximum displacement which can be considered in practice is assumed as $\epsilon$:

$$\frac{S_{10}}{S_{20}} \leq \frac{h - \epsilon}{\epsilon}$$

The number of electroconductive portions 10 per unit area, namely density of electroconductive portions, is preferably 10-70 portions/cm$^2$ in order that the portions 10 can correspond to the miniaturized printed wiring board and the like.

The shape of the projecting portion 11 in the plan view (in other words, the shape observed from the surface from which the portion projects) may be not only circle but also quadrangle or any other shape.

The electroconductive particles which are a constituent of the electroconductive portion 10 include, for example, particles of metals having magnetism such as nickel, iron, cobalt and the like or their alloys; these particles plated with gold, silver, palladium, rhodium or the like; particles of non-magnetic metals plated with an electroconductive magnetic substance such as nickel, cobalt or the like; inorganic particles such as glass beads and the like plated with an electroconductive magnetic substance such as nickel, cobalt or the like; and polymer particles plated with an electroconductive magnetic substance such as nickel, cobalt or the like; etc. In view of reducing the production cost, particles of nickel, iron or their alloys are particularly preferable. In view of such electric characteristics that the contact resistance is small, gold-plated particles are preferably used.

The particle diameters of the electroconductive particles are preferably 10-400 $\mu$m, more preferably 40-100 $\mu$m from the viewpoint of making the electric contact of the electroconductive particles with one another sufficient in the electroconductive portion 10 and facilitating the displacement upon applying pressure in the electroconductive portion 10.

The insulating, elastic high-molecular-weight substance which is another constituent of the electroconductive portion 10 is preferably a high-molecular-weight substance having a crosslinked structure, and uncrosslinked high polymer materials which can be used to obtain such high-molecular-weight substance having a crosslinked structure, include silicone rubber, polybutadiene, natural rubber, polyisoprene, styrene-butadiene copolymer rubber, acrylonitrile-butadiene copolymer rubber, ethylene-propylene copolymer rubber, urethane rubber, polyester rubber, chloroprene rubber, epichlorohydrin rubber and the like.

The material constituting the insulating portion 15 is generally the same high-molecular-weight substance as that constituting the electroconductive portion.

An explanation is made below of the present process for producing an anisotropically electroconductive sheet.

In the present production process, a pair of upper and lower molds are used, the molding surface of each of which is flat or has much smaller concaves and convexes than the height of the projecting portion of the anisotropically electroconductive sheet.

When molding is effected, a layer of a molding material consisting of a mixture of electroconductive particles having magnetism and a high polymer material (referred to hereinafter as the mixture sheet) is in the cavity of the mold. The mixture sheet has a thickness of 0.1-3 mm in view of practical use.

Subsequently, a magnetic field having an intensity distribution is applied to the mixture sheet in the direction of the thickness of the sheet in the state that a space is formed between the molding surface of the upper mold and the upper surface of the mixture sheet, and the molding material is fluidized while the electroconductive particles are transferred by the magnetic force to change the exterior shape of the mixture sheet, and then the molding material is cured, whereby an anisotropically electroconductive sheet is produced. In this case, the distance between the molding surface of the upper mold and the molding surface of the lower mold is required to be greater than the thickness of the mixture sheet; however, it is preferably 1-5 mm and particularly preferably 2-4 mm.

Since a space is thus present between the molding surface of the upper mold and the upper surface of the mixture sheet in the cavity of the mold, it follows that the electroconductive particles protrude together with the high polymer material by the action of magnetic field having an intensity distribution applied to the mixture sheet.

The means for curing the mixture sheet after changing the exterior shape of the mixture sheet is generally crosslinking.

A more detail explanation is made hereinafter. The mold is composed of a pair of corresponding upper and lower molds, each of these molds having a substantially flat plate-like shape as a whole, and it is preferable that the upper and lower molds be constructed so as to be mountable on an electromagnet or constructed integrally with an electromagnet, whereby the mixture sheet can be heat-cured while a magnetic field is applied to the mixture sheet.

In order to form projections which become the electroconductive portions in appropriate positions by applying a magnetic field to the mixture sheet, it is preferable that at least the upper mold, preferably both the upper mold and the lower mold, are so constructed that a base plate consisting of a ferromagnetic substance such as iron, nickel or the like has a layer consisting of portions of a ferromagnetic substance such as iron, nickel or the like for generating an intensity distribution in the magnetic field in the mold and portions of a non-magnetic substance such as a non-magnetic metal, e.g. copper or the like, a heat-resistant resin such as polyimide or the like, air, or the like which are arranged in the form of a mosaic (said layer is referred to hereinafter as the mosaic layer).

The molding surface of each of the upper and lower molds is flat or may have formed thereon much smaller concaves and convexes than the projection height of the projecting portions, for example, concaves and convexes of 0.5 mm or less in height or depth. When such concaves and convexes are formed on the molding surface of the lower mold, the corresponding concaves and convexes are formed on the lower surface of an anisotropically electroconductive sheet.

The thickness of each of the upper and lower molds is preferably 3 mm-5 cm, particularly preferably 5 mm-1 cm. When the upper and lower molds are thin, the strength of the mold is insufficient and hence the mold per se is deformed during the handling. On the contrary, when the upper and lower molds are thick, they become heavy and the handling of the molds becomes difficult.

The area, exterior shape and the like of each of the upper and lower molds are not critical, and it is necessary that a magnetic field having an intensity distribution can be formed by the action of electromagnet on the whole molding surface of at least the mixture sheet.

The thickness of the mosaic layer of the mold is preferably 0.1-1 mm in view of practical use. When the mosaic layer is thin, the intensity distribution of magnetic field becomes insufficient, and it becomes difficult to produce an anisotropically electroconductive sheet. On the contrary, when the mosaic layer is thick it takes too much time and labor for the preparation of a mold.

The arrangement, shape and the like of each of the ferromagnetic substance portion and the non-magnetic substance portion in the mosaic layer are determined based on the anisotropically electroconductive sheet to be prepared. That is, it is essential that the ferromagnetic substance portion be arranged in places corresponding to the electroconductive portions of the anisotropically electroconductive sheet, and the shape of the said ferromagnetic substance portion be adapted to the shape of the cross-section of the electroconductive portion.

The above-mentioned mold can be produced, for example, by the following method:

(1) From a ferromagnetic substance base plate are cut off portions at which non-magnetic substance portions are to be formed, by a method such as cutting, etching or the like, and thereafter, the cut portions are filled with a non-magnetic substance by a method of pouring a resin into the cut portions or plating the cut portions with copper to form the mosaic layer, thereby producing a mold.

(2) A non-magnetic substance plate is perforated at the portions at which ferromagnetic substance portions are to be formed, a ferromagnetic substance molded into the necessary shape is fixed in the resulting holes, and the resulting mosaic layer is attached to the ferromagnetic substance base plate to produce a mold.

The ferromagnetic substance constituting the mosaic layer of ferromagnetic substance portion and non-magnetic substance portion in a mold is not always identical in material with the ferromagnetic substance plate which becomes a base plate. A thin non-magnetic substance layer may be present between the two ferromagnetic substances. That is, it is sufficient that the two ferromagnetic substances be magnetically connected intimately to each other to form a series of magnetic circuit, thereby forming a sufficient magnetic field distribution in the mold. It is not always necessary that the two ferromagnetic substances be directly contacted with each other.

On the molding surface of the mold, it is not always necessary that the mosaic layer consisting of ferromagnetic substance portion and non-magnetic substance portion be bare and, for example, the mosaic layer may be covered with a layer of a non-magnetic resin if it is sufficiently thin.

In the mosaic layer consisting of ferromagnetic substance portions and non-magnetic substance portions, it is non always necessary that the non-magnetic substance portions be fixed in. A gas such as air may be present in the non-magnetic portions as far as such problems as insufficient strength of mold and the like are not raised. In this case, the molding surface of the mold can be made flat by attaching a sheet of a resin or the like to the surface of the ferromagnetic substance portion.

FIG. 3 shows an example of apparatus for producing an anisotropically electroconductive sheet, and in this figure, 1A refers to electromagnet, 20 and 30 to the upper mold and the lower mold, respectively, which constitute a mold, and 40 to a mixture sheet composed of a molding material, namely, an electroconductive particles having magnetism and an uncrosslinked, high polymer material.

In the upper mold 20 and the lower mold 30 of a mold, 21 and 31 refer to base plates each composed of a ferromagnetic substance, 22 and 32 to ferromagnetic substance portions for forming the electroconductive portions, 23 and 33 to non-magnetic substance portions, and the above mosaic layer of the upper mold 20 is composed of the ferromagnetic substance portions 22 and the non-magnetic substance portions 23 and the mosaic layer of the lower mold 30 is composed of the ferromagnetic substance portions 32 and the non-magnetic substance portions 33.

The example of FIG. 3 has such a structure that the upper mold 20 and the lower mold 30 can be separated from electromagnets 1A and 1B; however, it may be such a structure that magnetic electrodes of electromagnet can be as such used as the mold too.

FIG. 4 shows an example of the molding surface of the upper mold 20, in which many grooves are crosswise formed on one side of a plate 24 made of a ferromagnetic substance and the grooves enable the formation of the non-magnetic substance portions 23 and the magnetic substance around the groove forms the ferromagnetic substance portions 22.

Next, an explanation is made of a specific process for producing the anisotropically electroconductive sheet.

First of all, on the upper surface, namely, the molding surface, of the lower mold 30 which is placed horizontally is coated a mixture of electroconductive particles having magnetism and uncrosslinked high polymer material, in a uniform thickness to form the mixture sheet 40.

The thickness of the mixture sheet 40 is preferably 0.1-3 mm as stated above, and the volume fraction of electroconductive particles is preferably about 5-50% by volume, provided that from the viewpoint of enhancing the performance of the anisotropically electroconductive sheet, it is important to collectively consider and optimize the shape of the electroconductive portion of anisotropically electroconductive sheet, the volume fraction of electroconductive particles, the whole shape of the anisotropically electroconductive sheet, etc.

Subsequently, the upper mold 20 is put above the mixture sheet 40 in a face-to-face relation through the space 50. This space 50 is put for the purpose that when a magnetic field is applied to the mixture sheet 40, the electroconductive particles in the mixture sheet 40 can be transferred and the molding material forming the mixture sheet 40 is fluidized to change the exterior shape thereof, thereby enabling the electroconductive portions and the insulating portions to be formed. Incidentally, the distance from the molding surface of the lower mold 30 to the molding surface of the upper mold 20 becomes the thickness D of the finished anisotropically electroconductive sheet.

The upper mold 20 and the lower mold 30 which are in the above-mentioned state are set, respectively, on the electromagnets 1A and 1B, and the electromagnets 1A and 1B are worked to apply a magnetic field having an intensity distribution to the mixture sheet 40 in the direction of the thickness of the mixture sheet through the upper mold 20 and the lower mold 30, thereby protruding the electroconductive portions, and thereafter or while the magnetic field is applied, the uncrosslinked high polymer material is crosslinked. Thus, the electroconductive portions 10 and the insulating portions 15 are formed at one time.

When the structure used is such that the distance between the upper mold 20 and the lower mold 30 can be changed in the state that the magnetic field is applied, such an operation is possible that the upper mold 20 is placed just above the mixture sheet 40 at the beginning, the distance between the upper mold 20 and the lower mold 30 is gradually broadened while the magnetic field is applied and when the necessary distance has been reached the crosslinking is conducted.

The intensity of the magnetic field to be applied to the mixture sheet 40 is usually 200–20,000 gauss on the average in the cavity of the mold. The crosslinking temperature and time in the crosslinking reaction can be appropriately varied depending upon the type of uncrosslinked high polymer material, the period of time for which the electroconductive particles can be concentratedly transferred to the electroconductive portions, etc. However, when a room temperature-curing type silicone rubber is used, the crosslinking time is about 24 hours at room temperature, about 2 hours at 40° C. or about 30 minutes at 80° C.

In order to facilitate the concentrated transfer of the electroconductive particles to the electroconductive portions, the viscosity of the mixture sheet before the crosslinking reaction starts should preferably be $10^4$–$10^7$ poise under such conditions that the strain rate is $10^1$ sec at 25° C.

Next, the electric inspection unit of this invention is explained. FIG. 5 is a diagrammatic view illustrating explodedly an example of the electric inspection unit of this invention. In FIG. 5, 61 refers to an inspection head, 62 to an anisotropically electroconductive sheet, 63 to an off-glid adaptor, 64 to a printed circuit base board.

The unit of this example is a so-called both side inspection type unit which can inspect both sides of a printed wiring board 64 at the same time, and a set of the inspection head 61, the anisotropically electroconductive sheet 62 and the off-glid adaptor 63 is arranged on each of the sides of the printed wiring board 64. Incidentally, the anisotropically electroconductive sheet 62 is supported by a carrier board (not shown in the figure) perforated at places corresponding to the projecting portions of the sheet.

The inspection head 61 has pin-like inspection electrodes 65 arranged at the positions corresponding to the electroconductive portions 10 of the anisotropically electroconductive sheet 62.

The off-glid adaptor 63 is used for allowing the arrangement pattern of each portion to be inspected 64A of the printed wiring board 64 to correspond to the arrangement pattern of the inspection electrode 65. Incidentally, this off-glid adaptor 63 is selectively used according to the arrangement pattern of each portion to be inspected 64A of the printed wiring board 64, and when the arrangement pattern of each portion to be inspected 64A is identical with that of the inspection electrodes 65, the off-glid can be omitted.

In this unit, an anisotropically electroconductive sheet is interposed between many inspection electrodes 65 and the printed wiring board 64, and in this state, the electric inspection of the printed wiring board 64 is conducted.

That is, upon applying a pressure by a pressure-applying means (not shown in FIG. 5) to the inspection electrodes 65, the anisotropically electroconductive sheet 62 and the off-glid adaptors 63 which are arranged on both sides of the printed wiring board 64 as shown in FIG. 5 so that the printed wiring board is pressed from both sides thereof, the electroconductive portions 10 of the anisotropically electroconductive sheet 62 are pressed to exhibit effective electroconduction, whereby it becomes possible to inspect whether the electrical continuity or insulation of each electrode to be inspected of the printed wiring board is good or not.

The pressure-applying means is usually provided on the back side of the inspection head 61; however, an electric circuit necessary for the inspection is provided on the back side of the inspection head 61. Therefore, it is important to protect the electric circuit from dynamic stress.

In the anisotropically electroconductive sheet used in the electric inspection unit of this invention, the electroconductive portions are composed of the portions projecting from the surface of the insulating portions, and the projecting portions are densely filled with electroconductive particles, so that it is possible to make the contact of the electroconductive particles with one another sufficient, thereby making the resistivity value small in the conductive state of the electroconductive portion, and control the change in resistivity value with a change of pressure applied to a small value to prevent the electroconductivity from varying owing to non-uniform pressure applied.

Since the resistivity value in the conductive state of the electroconductive portions of the anisotropically electroconductive sheet are thus small and the change in resistivity value with a change of the pressure applied is small, the pressure applied to each electroconductive portion is not required to be highly uniform and the requirements for the pressure-applying means are considerably softened. Also, since the electroconductive portions per se in the projecting portions of the anisotropically electroconductive sheet prevent electric current from being spreaded in the transverse direction and exhibit the function of intermediary pins of a conventional intermediary pin system, a printed wiring board having many electrodes to be inspected can be electrically inspected with high reliability using a simple construction without adopting any complicated intermediary pin system.

In the present process for producing an anisotropically electroconductive sheet, the mixture sheet is formed in the cavity of a pair of upper and lower molds each having a flat or slightly uneven molding surface so that a space is formed between the molding surface of the upper mold and the mixture sheet, and in this state, a specific magnetic field is applied to the mixture sheet to change the exterior shape of the mixture sheet to a specific shape using the magnetic force, thereby producing the anisotropically electroconductive sheet. Therefore, the projection height of the projecting portion of the anisotropically electroconductive sheet can be substantially defined by the distance between the molding surface of the upper mold and the upper surface of the mixture sheet. Accordingly, the projection height can easily be controlled using a simple structure mold. On the other hand, when the cavity of the mold is completely filled with the molding material so as not to form any space in the cavity of the mold and the molding material is press-molded, the projection height of the projecting portion is determined uniquely by the depth of the grooves formed on the molding surface of the mold. Thus, it is difficult to control freely the projection height by one mold.

In this invention, molding is effected in the state that a space is formed between the upper surface of the mixture sheet and the molding surface of the upper mold, that is to say, without applying any direct pressure to the mixture sheet. Hence, the resistance to pressure required to the mold becomes small, the structure of the mold becomes simple, the weight of the mold can be decreased and hence the handling becomes easy. On the other hand, in the press-molding method wherein the cavity of the mold is filled with the molding material, the resistance to pressure required to the mold becomes large, and therefore, the structure of the mold becomes complicated. and the weight of the mold is increased to become inconvenient to handle.

As mentioned above, a space is formed between the molding surface of the upper mold and the upper surface of the mixture sheet in the mold; therefore, the release of the molded product, namely, an anisotropically electroconductive sheet, becomes very easy. On the other hand, in the press-molding method in which the cavity of the mold is completely filled with the molding material, it is necessary to form concaves and convexes corresponding to the projecting portions on the molding surface of the mold. Therefore, it becomes difficult to release the projecting portions from the mold, and there is a fear that the anisotropically electroconductive sheet may be damaged.

Since the molding surface of the mold is flat or nearly flat, the structure of the mold becomes simpler, and since the shape of the molding surface of the lower mold may be any shape and the portions corresponding to electroconductive portions may project or be depressed, the structure is simpler. Incidentally, in the press-molding method, it is necessary to provide projecting portions on the molding surface of the mold for forming the insulating portions of the anisotropically electroconductive sheet at which portions no projections are present, and hence, the structure of the mold becomes complicated.

This invention is explained below referring to Examples and Comparative Examples. However, this invention should not be interpreted to be limited to them.

EXAMPLE 1

On one side of an iron plate having a square shape of 12 cm in side length and 8 mm in thickness are formed crosswise 51 grooves of 0.46 mm in depth and 1.7 mm in width at a pitch of 2.6 mm in each direction. An upper mold and a lower mold were prepared each consisting of non-magnetic substance portions formed by filling the grooves with copper and ferromagnetic substance portions consisting of iron around the grooves.

The same production unit as in FIG. 3 was prepared using these upper and lower molds, and the distance between the upper and lower molds was adjusted as shown in Table 1, and the mixture sheet having a composition as shown in Table 1 was subjected to crosslinking reaction under the production conditions as shown in Table 1 to produce an anisotropically electroconductive sheet having a construction as shown in Table 2.

EXAMPLES 2 AND 3 AND COMPARATIVE EXAMPLE 1

The same procedure as in Example 1 was repeated, except that the constitution of the production unit, the composition of the mixture sheet and the production conditions were changed to those shown in Table 1, to produce an anisotropically electroconductive sheets 2 and 3 having a construction as shown in Table 2 and an anisotropically electroconductive sheet a for comparison.

TABLE 1

|  | Construction of production apparatus Distance between upper mold and lower mold (mm) | Composition of mixture sheet | | | | Production conditions | | | |
|---|---|---|---|---|---|---|---|---|---|
|  |  | Electroconductive particles | | Uncrosslinked high-polymer-material | | Thickness of mixture sheet 40 (mm) | Crosslinking temperature (°C.) | Crosslinking time (hr) | Intensity of magnetic field (gauss) |
|  |  | Kind average diameter (μm) | Amount (vol. %) | Kind | Amount (vol. %) |  |  |  |  |
| Example 1 | 2.0 | Nickel 100 | 8 | Room temperature curing type silicone rubber | 92 | 1.5 | 100 | 0.5 | 2,000 |
| Example 2 | 3.0 | Nickel 100 | 10 | Same as above | 90 | 2.0 | 100 | 0.5 | 2,000 |
| Example 3 | 2.0 | Nickel 100 | 10 | Same as above | 90 | 1.1 | 100 | 0.5 | 2,000 |
| Comp. Ex. 1 | 0.7 | Nickel 100 | 2 | Same as above | 98 | 0.7 | 100 | 0.5 | 2,000 |

Note:
Room temperature-curing type silicone rubber contains 10 wt. % of a crosslinking agent.

TABLE 2

|  | Anisotropically electroconductive sheet No. | Height h of projecting portion | Thickness d of insulating portion | h/d ratio | Shape of plan view of electroconductive portion |
|---|---|---|---|---|---|
| Example 1 | 1 | 1.5 mm | 0.30 mm | 4.8 | 1.0 × 1.0 mm square |
| Example 2 | 2 | 2.1 mm | 0.70 mm | 3.0 | 1.0 × 1.0 mm square |
| Example 3 | 3 | 1.5 mm | 0.45 mm | 3.3 | 0.9 × 0.9 mm square |
| Comp. Ex. 1 | a | 0 mm | 0.7 mm | 0 | — |

|  | Thickness D of electroconductive | Degree of filling with electroconductive | Value | $r/R$ | $S_{10}/S_{20}$ | Density of electroconductive |
|---|---|---|---|---|---|---|

TABLE 2-continued

|  | portion | particles | of R | ratio | ratio | portions |
|---|---|---|---|---|---|---|
| Example 1 | 1.8 mm | 43 vol. % | 1.7 | 0.49 | 0.54 | 15.5 portions/cm² |
| Example 2 | 2.8 mm | 46 vol. % | 1.5 | 0.69 | 0.37 | 15.5 portions/cm² |
| Example 3 | 2.0 mm | 44 vol. % | 1.55 | 0.63 | 0.41 | 15.5 portions/cm² |
| Comp. Ex. 1 | 0.7 mm | 12 vol. % | — | 1.1 | 0.21 | 15.5 portions/cm² |

Note:
R: Outer diameter of projecting portion.
r: Shortest distance between adjacent projecting portions.
$S_{10}$ Sum total of areas of projecting portions at a given area S.
$S_{20}$ Sum total of areas of insulating portions at a given area S.

As is clear from Tables 1 and 2, in the anisotropically electroconductive sheets 1 to 3 produced, a plurality of electroconductive portions extending in the direction of the thickness of the sheet are arranged so that the electroconductive portions are insulated from one another with insulating portions, and each electroconductive portion is formed in a portion projecting from the surface of the insulating portion on one side of the sheet, and an insulating, elastic, high-molecular-weight substance is densely filled with electroconductive particles.

On the other hand, the anisotropically electroconductive sheet a for comparison has been produced under such conditions that the distance between the upper mold and the lower mold is the same as the thickness of the mixture sheet, and therefore, the sheet is flat and has no projecting portion formed thereon.

EXAMPLES 4 TO 6

Electric inspection units having the same construction as shown in FIG. 5 were produced using the anisotropically electroconductive sheets obtained in Examples 1 to 3.

These electric inspection units were driven and the electroconductive portions were gradually compressed from their original length, whereby the following tests were conducted:

(1) A test for determining the maximum change in total resistivity values between the inspection electrodes and the other electrodes to be inspected of the base plate when the compression displacement of the electroconductive portion is within a range of 0.1 to 0.5 mm per inspection electrode.

(2) A test for determining the total resistivity values between the inspection electrodes and the other electrodes to be inspected of the base plate in the conductive state where the compression displacement of the electroconductive portion is 0.3 mm per inspection electrode.

The results obtained are shown in Table 3. Incidentally, the found values in Example 4 are shown by Curve I in FIG. 6.

COMPARATIVE EXAMPLE 2

A conventional electric inspection unit in which an intermediary pin system having the construction shown in FIG. 7 was adopted, was prepared using the anisotropically electroconductive sheet, both surfaces of which were flat, obtained in Comparative Example 1.

This electric inspection unit was driven to conduct the same tests as in Example 4. The results obtained are shown in Table 3 and the found values are shown by Curve II in FIG. 6.

TABLE 3

|  | Anisotropically electroconductive sheet No. | h/D ratio | Degree of filling with electroconductive particles | Maximum change in resistivity when the compression-displacement of electroconductive portions is in a range of 0.1–0.5 mm | Resistivity when compression-displacement is 0.3 mm |
|---|---|---|---|---|---|
| Example 4 | No. 1 | 4.8 | 43 vol. % | 0.020 Ω | 0.027 Ω |
| Example 5 | No. 2 | 3.0 | 46 vol. % | 0.025 Ω | 0.035 Ω |
| Example 6 | No. 3 | 3.3 | 44 vol. % | 0.051 Ω | 0.032 Ω |
| Comp. Ex. 2 | No. a | 0 | 12 vol. % | 0.071 Ω | 0.090 Ω |

Note:
h: Height of projecting portion
D: Thickness of insulating portion

As can be seen from the results in Table 3 and FIG. 6, when the anisotropically electroconductive sheets 1 to 3 are used, the resistivity values in the conductive state of the electroconductive portions which are arranged at a high density are small, so that the inspection precision can be enhanced. In addition, even when the pressure applied to each electroconductive portion is varied the same electroconductivity is obtained, and therefore, the requirements for the pressure-applying means are considerably softened and electric inspection with a high reliability can be conducted.

The effects of this invention can be summarized as follows:

According to the electric inspection unit of this invention, the structure is simple, the weight can be decreased and the resistivity values in the conductive state of the electroconductive portions of an anisotropically electroconductive sheet are small, so that good electroconductivity can be obtained. In addition, the change in resistivity value of the electroconductive portions with a change in pressure applied is small, and even when the pressure applied to each electroconductive portions is non-uniform, an electroconductivity at a constant level can be surely obtained and inspection with a high inspection precision can be conducted with a high reliability.

The electroconductive portions per se formed in the projecting portions in the anisotropically electroconductive sheet prevent electric current from spreading in the transverse direction to exhibit their function of assuring the point-to-point correspondence between the inspection electrode and the other electrodes to be inspected. Therefore, electric inspection of printed wiring board having many portions to be inspected can be surely conducted using an electric inspection unit having a simple construction without a conventional intermediary pin system.

In addition, according to the present process for producing an anisotropically electroconductive sheet, a molding material is molded using a magnetic force in the state that a space is present between the molding surface of the upper mold and the upper surface of the mixture sheet, so that the projection height of the projecting portions can be defined by the space and hence the control of the projection height is easy.

No pressure as in the press-molding method is applied to the mixture sheet in the cavity of a mold, so that the pressure resistance required for the mold is small.

Moreover, the molding surface of a mold is flat or nearly flat, so that the release of an anisotropically electroconductive sheet from the mold is very easy. Also, the requirements for a mold are greatly softened and the freedom for designing a mold becomes great.

What is claimed is:

1. A process for producing an anisotropically electroconductive sheet composed of electroconductive particles and an insulating, elastic, high-molecular weight substance, which sheet has a plurality of electroconductive portions extending in the direction of thickness of the sheet, which portions are arranged so as to be insulated from one another by insulating portions each consisting of the insulating, elastic, high-molecular-weight substance and form portions projecting from the surface of the insulating portions, said electroconductive portions being composed of the insulating, elastic, high-molecular-weight substance densely filled with electroconductive particles, which process comprises:

forming a layer of a molding material consisting of a mixture of magnetic electroconductive particles and the high-molecular-weight substance in the cavity of a mold consisting of a pair of upper and lower molds, the molding surface of each of the upper and lower molds is flat and has much smaller convexes or concaves than the height of the projecting portions of the anisotropically electroconductive sheet to be produced; and applying a magnetic field having an intensity distribution to the molding material layer in the direction of thickness of the layer in the state that a space is present between the molding surface of the upper mold and the molding material layer, to fluidize the molding material and simultaneously move the electroconductive particles in the molding material to areas to which the magnetic field is applied, thereby allowing the electroconductive particles to gather in said areas to form the electroconductive portions including the projecting portions.

2. The process according to claim 1, wherein the thickness of the molding material sheet is 0.1 to 3 mm.

3. The process according to claim 2, wherein the space between the molding surface of the upper mold and the molding surface of the lower mold is larger than the thickness of the molding material layer.

4. The process according to claim 1, wherein the curing is effected by crosslinking.

5. The process according to claim 1, wherein the upper mold or both the upper and lower molds have such a construction that a base plate consisting of a ferromagnetic substance has a layer consisting of ferromagnetic substance portions and non-magnetic portions which are arranged in the form of a mosaic.

6. The process according to claim 5, wherein the ferromagnetic substance is iron or nickel and the non-magnetic substance is a non-magnetic metal, a heat-resistant resin or air.

7. The process according to claim 5, wherein the layer has a thickness of 0.1 to 1 mm.

8. A process for producing an anisotropically electroconductive sheet which is composed of magnetic electroconductive particles and a substance which is insulating, elastic and has a high molecular weight, comprising the steps of:

forming a layer of molding material consisting of a mixture of said substance and the electroconductive particles in a cavity formed by upper and lower spaced apart surfaces of a mold, a space existing between the layer of molding material and the upper surface, applying an anisotropic magnetic field to said layer thereby causing movement of the particles from throughout the layer to regions of the layer having high magnetic fields, wherein said movement of the particles induces projections from an upper surface of the layer at the regions having high magnetic fields.

* * * * *